United States Patent
Vasti et al.

(10) Patent No.: US 10,566,586 B2
(45) Date of Patent: Feb. 18, 2020

(54) LEAKTIGHT BOX FOR ALKALINE BATTERIES

(71) Applicant: SAFT, Bagnolet (FR)

(72) Inventors: Philippe Vasti, Le Taillan Medoc (FR); Xavier Tridon, Bordeaux (FR)

(73) Assignee: SAFT, Bagnolet (FR)

( * ) Notice: Subject to any disclaimer, the term of this patent is extended or adjusted under 35 U.S.C. 154(b) by 434 days.

(21) Appl. No.: 14/434,478

(22) PCT Filed: Oct. 9, 2013

(86) PCT No.: PCT/EP2013/071086
§ 371 (c)(1),
(2) Date: Apr. 9, 2015

(87) PCT Pub. No.: WO2014/056998
PCT Pub. Date: Apr. 17, 2014

(65) Prior Publication Data
US 2015/0295213 A1 Oct. 15, 2015

(30) Foreign Application Priority Data

Oct. 10, 2012 (FR) .................................... 12 59680

(51) Int. Cl.
*H01M 2/10* (2006.01)
*B21J 15/02* (2006.01)
*G06F 17/50* (2006.01)

(52) U.S. Cl.
CPC ........... *H01M 2/1077* (2013.01); *B21J 15/02* (2013.01); *G06F 17/50* (2013.01); *H01M 2/1083* (2013.01);

(Continued)

(58) Field of Classification Search
None
See application file for complete search history.

(56) References Cited

U.S. PATENT DOCUMENTS

| 6,395,417 B1 | 5/2002 | Frazier | |
|---|---|---|---|
| 2008/0063929 A1* | 3/2008 | Byun | H01M 2/202 429/121 |

(Continued)

FOREIGN PATENT DOCUMENTS

WO 2011/134828 A1 11/2011

OTHER PUBLICATIONS

International Search Report for PCT/EP2013/071086 dated Jan. 15, 2014 [PCT/ISA/210].

*Primary Examiner* — Wyatt P McConnell
(74) *Attorney, Agent, or Firm* — Sughrue Mion, PLLC

(57) ABSTRACT

Leaktight box for alkaline electrolyte battery, comprising an assembly of metal plates, where:
 a first and a second plate overlap in a zone of overlap and are assembled with rivets each comprising a head, a stem and a bulb;
 the stem of the rivets is deformed in such a way as to occupy in a leaktight manner substantially all of the volume of said holes of the first and second plates;
 preferably an elastomer seal comprising a material chosen from among a butyl rubber, an ethylene-propylene-diene terpolymer and a nitrile rubber, where said seal is disposed in continuity with the overlap zone in continuous contact with the first and the second plate in such a way as to complete the leaktightness of the box.

12 Claims, 3 Drawing Sheets

(52) U.S. Cl.
CPC ...... *H01M 2/1094* (2013.01); *H01M 2220/20* (2013.01)

(56) References Cited

U.S. PATENT DOCUMENTS

2010/0136402 A1    6/2010  Hermann et al.
2012/0260490 A1*  10/2012  Sakoda ............... F16B 19/1045
                                                    29/525.06

* cited by examiner

LEAKTIGHT BOX FOR ALKALINE BATTERIES

CROSS REFERENCE TO RELATED APPLICATIONS

This application is a National Stage of International Application No. PCT/EP2013/071086, filed on Oct. 9, 2013, which claims priority from French Patent Application No. 12 59 680, filed on Oct. 10, 2012, the contents of all which are incorporated herein by reference in their entirety.

The technical field of the invention is that of containers used to store cells comprising a liquid electrolyte. The invention also relates to manufacturing processes for such battery containers.

STATE OF THE ART

A secondary battery generally comprises a plurality of secondary cells arranged side by side. The cells are connected together in series or in parallel depending on the nominal operating voltage of the electrical load to be supplied and the amount of energy it is intended to provide to the latter. For easy transport and storage of the secondary cells constituting the battery, they are generally placed in a common enclosure, which according to IEC 60050-482 is termed a battery tray. The battery tray is defined as a container with a base and walls for holding several storage cells. Such a battery tray is generally composed mainly of a plurality of metal plates assembled together.

The battery tray has a function in addition to that of connecting (interfacing) with rolling stock such as railway equipment, which is that of containing any possible leakage of electrolyte or material that could escape from one or more secondary cells and possibly cause damage to the equipment located in the space around the battery storage area. Indeed, the electrolyte may be acid in the case of lead acid batteries or be a strong base such as KOH, LiOH or NaOH in the case of alkaline secondary cells. To prevent possible corrosion of the equipment or the space around the battery storage area, the battery tray needs to be liquid tight.

An assembly system using nuts and bolts is sensitive to vibration. These can cause a loosening of the nut and bolt system and lead to a leak.

US patent application 2010/0136402 discloses an enclosure for secondary cells. This enclosure has a lower housing member and an upper housing member. The lower housing member and upper housing member are assembled by bolts. The moisture barrier is provided by a seal or gasket made of butyl rubber which is inserted and compressed between a surface of the lower housing member and a surface of the upper housing member. The bolts exert a compressive force which causes crushing of the seal thereby creating a sealing region at the periphery of the upper housing member. The compression force is calculated so that it is sufficient to allow deformation of the gasket which penetrates into surface irregularities but is below a certain limit beyond which compaction under compression of the seal would be experienced, which would over time lose its elastic properties and cease to provide a seal.

U.S. Pat. No. 6,395,417 discloses a system for storing secondary cells including a spill containment system. This spill containment system includes a material capable of absorbing electrolyte leakage, for example sulfuric acid in a lead-acid battery. The spill containment system includes a rail which can be fixed to the floor or other structure by means of a screw, nail or other fastening device. Sealing is provided for example by applying a cord of butyl rubber.

In both documents it is the combination of a seal made of butyl rubber with compression means, such as a bolt, which does the sealing. The bolt does not ensure the sealing function alone.

Currently, assembly of the metal plates, in particular of the bottom plate and side walls is done by welding them together, that is to say, by sheet metal welding. It does currently not appear possible to obtain a leakproof assembly under economically viable conditions by any other assembly technique. The conditions of use of battery trays are effectively particularly severe and the assembly must withstand corrosive environments, intense vibrations, especially for applications in the transport field (use in a train). Nevertheless, the technique of assembly by welding poses the following problems:

- possible appearance of cracks or corrosion points at spot weld points;
- welding parameters vary depending on the nature of the materials to be welded and must be adapted by the welder;
- the welding operation requires qualified staff and its cost is relatively high;
- two materials of different types may be incompatible for welding;
- a bad seal between two metal plates is sometimes observed.

One therefore seeks to obviate the above drawbacks and to obtain a battery tray for an alkaline electrolyte battery which is impermeable to liquids, while avoiding the use of welding for joining the plates.

SUMMARY OF THE INVENTION

To this end, the invention provides a leakproof battery tray for an alkaline electrolyte battery comprising an assembly of metal plates, in which:

- a first metal plate is provided with a series of holes in an area of overlapping;
- a second metal plate is provided with a series of holes arranged to face those of the first metal plate in the area of overlapping;
- the two plates are overlapped in the area of overlapping and are assembled together in this area by rivets each having a head, a shank and upset head;
- the head and upset head of the rivets abut against a surface of each plate, said surface extending beyond the surface area of each hole;
- the shank of the rivet is deformed so as to substantially occupy in a sealed manner the entire volume of said holes of the first and second plates.

Preferably, an elastomeric seal comprising a material selected from butyl rubber, ethylene-propylene-diene terpolymer and nitrile rubber, wherein said seal is disposed with continuity at the area of overlapping, in continuous contact with the first and the second plate so as to complete the sealing of the battery tray.

Surprisingly, it has been found that the combined use of rivets with preferably elastomeric seals of the type described above provides a battery tray having excellent sealing and excellent resistance to vibration. Indeed, the general opinion in the technical field of manufacturing of battery trays was, firstly, that assembly by rivets would guarantee neither good resistance to vibration nor good sealing and secondly that there was no seal for a metal battery tray able to withstand the corrosive nature of the alkaline electrolyte. Now, we have found that the battery tray of the invention can be subjected to very strong vibrations without observing a deterioration of mechanical strength or a leak. It may for example be disposed on the bed or support structure of a means of transport, such as a train, which is very subject to vibration.

The metal plates of the battery tray according to the invention can be assembled without the use of welding or a nut and bolt system, which simplifies the assembly process and also decreases its cost.

The Applicant has also observed that when the elastomeric seal is as described above, electrolyte absorption by the seal in the event of electrolyte leakage of a secondary cell in a battery tray is limited and that the seal is not degraded by the electrolyte.

According to one embodiment, the first plate is disposed in the area of overlapping directed towards the inside of the battery tray and is caused to be in contact with the alkaline electrolyte and the second plate is disposed in the area of overlapping directed towards the outside of the battery tray and is not caused to be in contact with the alkaline electrolyte in this area, and the series of holes in the first plate in the area of overlapping is arranged in the vicinity of an edge of the first plate, and the elastomeric seal covers said edge.

According to one embodiment, each metal plate is selected from:
 a flat plate;
 a folded plate;
 a shaped plate.

According to an embodiment, assembly of the plates is obtained only with the aid of rivets.

According to an embodiment, the plate assembly is devoid of welding.

According to an embodiment, the elastomeric seal comprises a butyl rubber which is a copolymer of isobutylene and isoprene.

According to an embodiment, the elastomeric seal comprises a nitrile rubber which is a copolymer of butadiene and acrylonitrile.

According to an embodiment, the seal is preformed.

According to an embodiment, the seal is disposed at the edge of the area of overlapping and is not compressed by the action of the rivets.

According to an embodiment, the seal is disposed in the area of overlapping between the first and the second plate and is compressed by the action of the rivets.

The invention also provides a method of manufacturing a sealed battery tray for an alkaline electrolyte battery comprising a plate assembly, which method comprises the steps of:
 providing a first metal plate provided with a series of holes in an area of overlapping;
 providing a second metal plate provided with a series of holes arranged to be opposite those of the first metal plate in the area of overlapping, the two plates being intended to overlap in the area of overlapping;
 assembling the two plates in the area of overlapping using rivets each having a head, a shank and an upset head so that the head and upset head of the rivets abut against a surface of each plate, said surface extending beyond the surface area of each hole; and whereby the shank of the rivet is deformed so as to substantially occupy in a sealed manner the entire volume of said holes of the first and second plates;
 preferably placing an elastomeric seal comprising a material selected from a butyl rubber, an ethylene-propylene-diene terpolymer and a nitrile rubber, wherein the seal is disposed with continuity at the area of overlapping, in continuous contact with the first and the second plate so as to complete the sealing of the battery tray.

According to an embodiment, each metal plate is selected from:
 a flat plate;
 a folded plate;
 a shaped plate.

The invention also provides a method for designing an assembly of a sealed battery tray for an alkaline electrolyte battery according to the invention, implemented by computer means, comprising the steps of:
 in a metal plate data base, selecting at least two metal plates to be assembled, wherein each metal plate is defined at least by its metallurgical nature and by its thickness;
 selecting an area of overlapping between the metal plates to be assembled at least defined by a width thereof;
 determining a drilling pattern of a series of holes to be machined in each area of overlapping, where the holes are at least defined by their diameter and spacing, and determination of appropriate rivets wherein the rivets are at least defined by a diameter of their shank through computer calculation using a method comprising establishing multi-parameter relations based at least on the following parameters: hole diameter, hole spacing, diameter of the shank of the rivets.

In one embodiment, the step of establishing multi-parameter relations employs a digital resource selected from a relational database between selected parameters, an equation between selected parameters, nomograms between selected parameters.

In one embodiment, the rules for rejecting choice of parameters are adapted to reject configurations where there appears a risk of puncturing the metal plates by the rivets and/or a risk of tearing the metal plates along a line of rivets.

The invention also provides a computer program product comprising at least a sequence of stored instructions, accessible to a processor, wherein execution of the sequence of stored instructions causes the method steps for designing an assembly of a sealed battery tray for an alkaline electrolyte battery to be implemented.

Finally, the invention provides a computer-readable data carrier adapted to allow implementation of a least one of a sequence of instructions of the computer program product.

BRIEF DESCRIPTION OF DRAWINGS

Other features and advantages of the present invention will become apparent upon reading the following description of non-limiting exemplary embodiments, in particular with reference to the accompanying drawings in which.

For reasons of clarity, the dimensions of the components shown in these figures are not necessarily in proportion to their actual sizes. Identical references in the figures correspond to depiction of the same parts.

DESCRIPTION OF EMBODIMENTS

Figure 1:
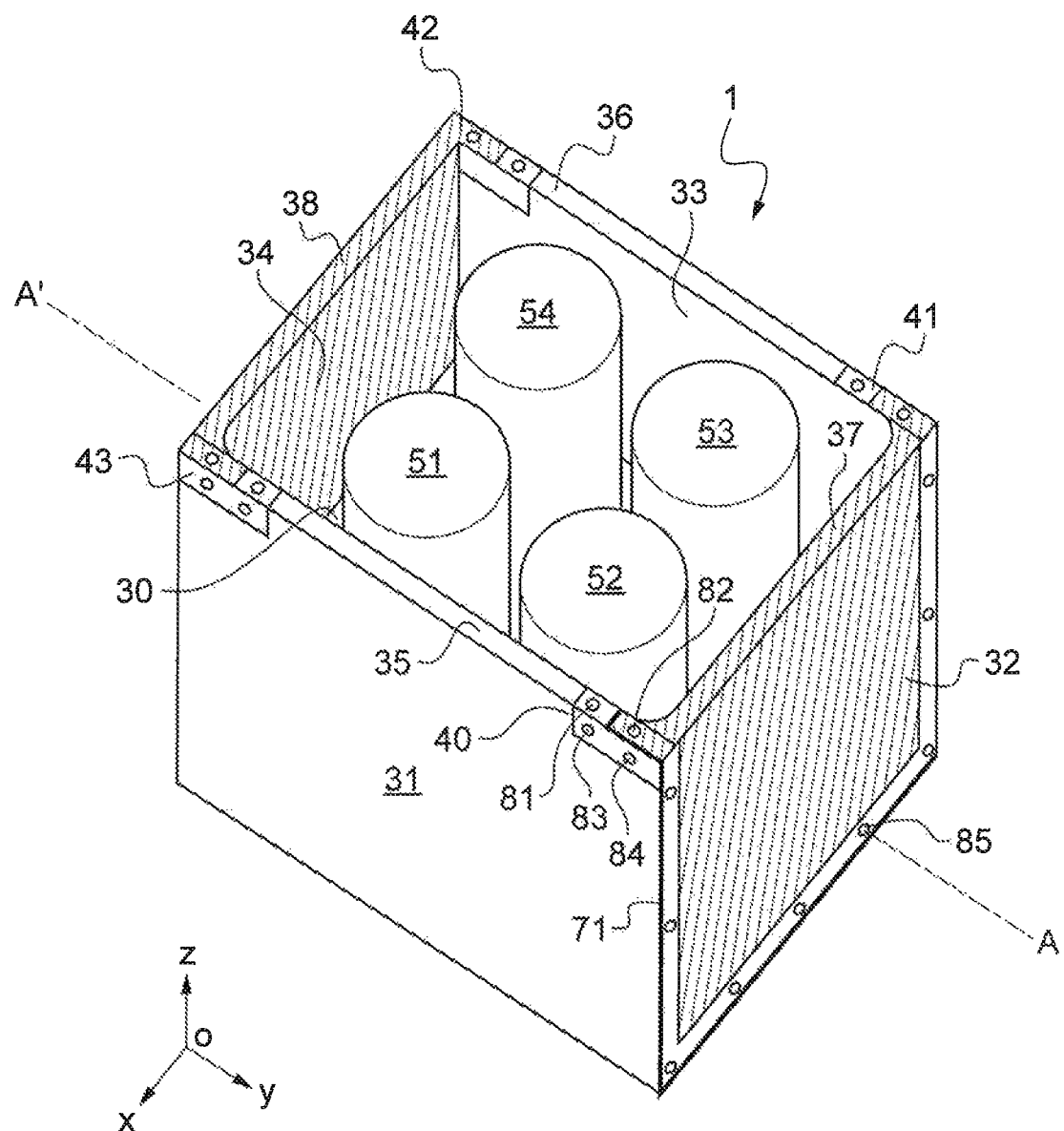
FIG. 1 is a perspective view of a battery tray 1 according to the invention containing four cells of a cylindrical format.

FIG. 1 shows a perspective view of a battery tray 1 according to the invention. It is in the form of a parallelepiped. This parallelepiped comprises a metal plate 30 forming a base upon which the secondary cells (51, 52, 53, 54) are resting and four side plates, a left side plate 31, a front side plate 32, a right side plate 33 and a rear side plate 34. The upper side of the battery tray, that is to say the side opposite to the bottom is open to allow introduction of the cells into the inside the battery tray. The upper left and right side plates has a flanged lip (35, 36) which corresponds to the portion of the upper edge of these plates folded directed towards the inside of the battery tray in a direction substantially perpendicular to the direction of the plate. The front and rear upper ends of the left and right hand side plates 31, 33 each have portions, which will be called recesses, where the flanged lip is missing, into which front and rear plates 32 and 34 of the battery tray fit. The upper edges of front plate and the rear plate of the battery tray also each have a flanged lip (37, 38).

This flanged lip is wider at each one of the ends of the front plate and rear plates. These wider portions engage into the recesses at the upper edges of the left-hand and right-hand side plates. Angle brackets (40, 41, 42, 43) are used for fixing the front 32 and rear 34 plates of the battery tray to the left-hand 31 and right-hand 33 side plates. The plates are assembled using rivets (81, 82, 83, 84) and the sealing is completed by a seal or gasket 71. Flanged lips 35 and 37 are connected through angle bracket 40. An elastomeric seal 71 will fill, firstly, the space between flanged lip 35 and flanged lip 37 and, secondly, the space between flanged lip 37 and left side plate 31. The elastomeric seal also serves to complete the sealing between the bottom plate 30 and front plate 32.

Figure 3:
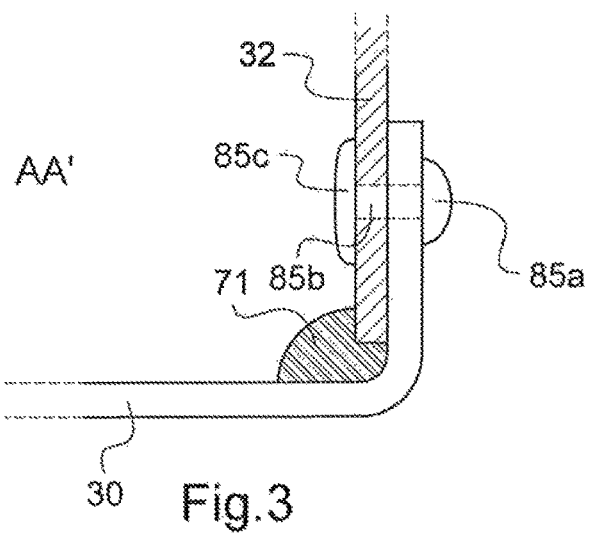
FIG. 3 is a diagrammatic view of the area where the metal plate 30 forming the bottom of the battery tray and the front side plate 32 of the battery tray are assembled. This view corresponds to a cross-section of the battery tray in the direction AA' in FIG. 1.
Figure 4:
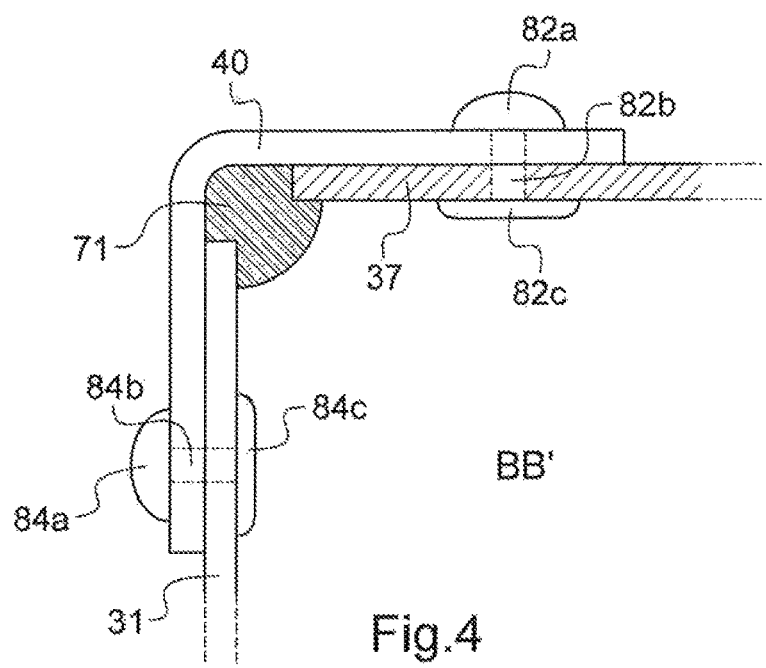
FIG. 4 is a diagrammatic view of an area of assembly in a cross-section in direction BB' of FIG. 2 wherein a first metal plate 37 is assembled to a second metal plate having the shape of an angle bracket 40.
Figure 5:
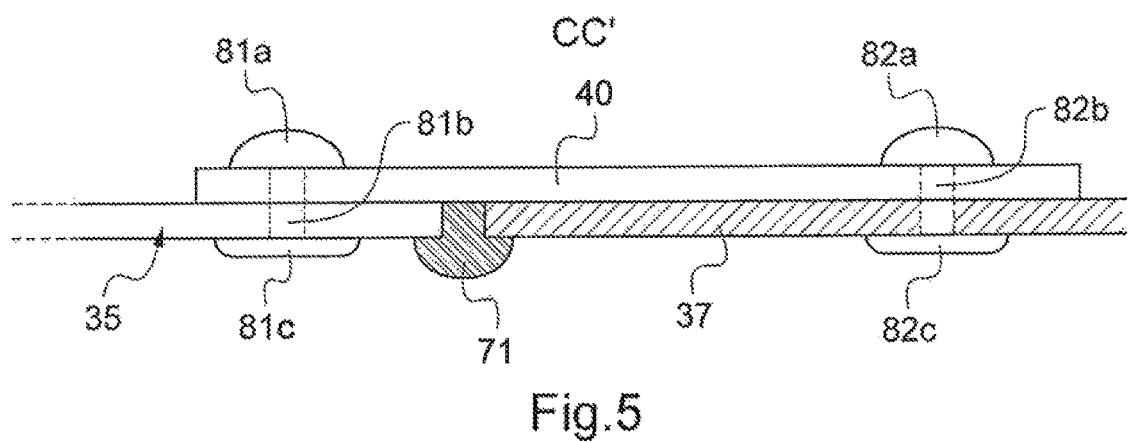
FIG. 5 is a diagrammatic view of an area of assembly in a cross-section in direction CC' of FIG. 2 wherein flanged lip 35 of left side plate 31 is assembled with flanged lip 37 of the front side plate 32.

Assembly can be performed in several areas of and some of them are detailed below:

1) a first area of assembly shown diagrammatically in FIG. 3 which corresponds to the assembly of bottom plate 30 with front plate 32;

2) a second area of assembly shown diagrammatically in FIG. 4 which corresponds to the assembly of flanged lip 37 of the front plate with left side plate 31 using angle bracket 40;

3) a third area of assembly shown diagrammatically in FIG. 5 which corresponds to the assembly of flanged lip 35 of left side plate 31 with flanged lip 37 of front side plate 32 using angle bracket 40;

The first two areas of assembly 1) and 2) above form a corner of the battery tray, while assembly area 3) is located on one of the faces of the battery tray, in this case the upper side of the battery tray.

In the case where the assembly area forms a corner of the battery tray, a first metal plate is flat and the second metal plate may either be a bent plate or a shaped plate, that is to say a material to which a specific shape has been imparted. The folded plate can have an L-shape. The shaped plate can for instance be an angle bracket, a triangular cross-section tube or a square section tube. In the case where the second plate is a folded plate or an angle bracket, the region of the fold of the second plate corresponds to one of the corners of the battery tray.

In a first embodiment shown in FIG. 3, a first plate 32 is assembled with a second plate 30 which has previously been bent to form a substantially right angle. The first plate is the front side plate 32 of the battery tray and the second plate, which is bent in advance, is the bottom plate 30 of the battery tray. FIG. 3 shows the two plates seen in the direction of their thickness. The view in FIG. 3 corresponds to a section along axis AA' shown on FIG. 1. One end of the first plate 32 is provided with a series of holes. The diameter and spacing of these holes is determined in advance for example according to the method of design described below. One end of the second plate also carries holes, the diameter and spacing of which are identical to those of the first plate. The series of holes in the first plate coincides with the series of holes in the second plate. The end portion of the first plate in contact with the end portion of the second plate defines an area of overlapping. The two plates are held in contact with each other while the shank 85$b$ of a rivet is inserted into each hole. The rivet head 85$a$ corresponds to the end of the largest section of the shank which is in abutment with metal plate 30. In FIG. 3, the rivet is inserted into the hole from outside the battery tray, that is by first passing it through the second plate, and then passing it through the first plate with the end of the rivet shank protruding inside the battery tray. The inverse could be considered, consisting in introducing the rivet shank from the inside of the battery tray so that the rivet head comes into abutment with the plate facing the inside of the battery tray. The end of the shank opposite the head then protrudes outside the battery tray. The end of the shank opposite the head is then deformed and flattened against the surface of one of the two plates. The end of the shank opposite the head is referred to as the upset head 85$c$: this is the portion of the shank which gets deformed upon assembly and which is outside the hole. The deformation of the end of the shank to form the upset head is used to assemble the two plates by compression. During the riveting, deformation of the rivet shank occurs which then comes to almost completely occupy, in a sealing manner, the space formed by the apposition of the two coinciding holes. This makes it possible to seal the area of overlapping against any liquid leakage. The spacing and diameter of the holes determined during the design process make it possible to obtain tightness of the battery tray to liquids. The spacing between two rivets depends on desired assembly area rigidity, the thickness of the plates and the nature of the rivet. The rivets used may be selected from:

a classic rivet
a blind rivet
a structural blind rivet
a rivet of the 'Rivelon' flattened ring type The diameter of the shank of the rivet is generally between 1 and 5 mm. The minimum distance between the axes of the shanks of two neighboring rivets is generally at least equal to 2.5 times the diameter of the shank of the rivets. The value of 2.5 is common in the area of riveting and is a good compromise between the amount of material and an assembly having satisfactory strength.

An operator can place a rivet while having access only to one side of the plate, in contrast to a method of assembling using bolts which requires the operator to have access to both sides of the plate to place the nut and bolt. An assembly process using rivets thus offers better accessibility.

To complete the sealing afforded by the rivets, upon completion of the riveting operation, an elastomeric seal 71 of a specific composition detailed below is placed, in contact with the edge of the first plate and the region of the fold of the second plate. The seal already provided by the rivets is reinforced by the presence of the seal or gasket because it prevents any infiltration of electrolyte in an area of overlapping, that is to say between the face of the first outwardly facing plate battery tray and the face of the second plate directed towards the inside of the battery tray. This makes it possible to avoid further deterioration of the rivet in the event of electrolyte leakage. Sealing is ensured by the presence of rivets. The presence of the seal is optional.

The gasket or seal is placed upon completion of the riveting operation. It is consequently not compressed by the action of the rivets. It does not get deformed, as would be the case if it were to be compressed by a bolt or a screw.

In a second embodiment shown in FIG. 4, the second metal plate is a shaped component such as an angle bracket 40 having two L-shaped arms. Flanged lip 37 of the front plate is assembled onto the horizontal arm of the angle bracket using a series of rivets, of which only one, 82, is shown in FIG. 4, according to the method described above. The rivet 82 has a head 82a, a shank 82b and an upset head 82c which corresponds to the portion of the shank which gets deformed upon assembly outside of the hole. This is followed by assembling a third metal plate 31 to the vertical leg of the angle bracket using a series of rivets, of which only one, 84, is shown in FIG. 4, using the same method. The rivet 84 has a head 84a, a shank 84b and an upset head 84c. The first metal plate 37 is consequently assembled to the third metal plate 31 through a section having the shape of an angle bracket 40. Finally, in order to enhance sealing, of, firstly, an area of overlapping of flanged lip 37 with the horizontal leg of the angle bracket and, secondly, the vertical leg of the angle bracket with the third metal plate, an elastomeric seal is placed so that it is in contact with the edge of flanged lip 37, the edge of the third plate 31 and the corner of angle bracket 40, that is to say the point of junction of the two arms making up the angle bracket.

Figure 2:
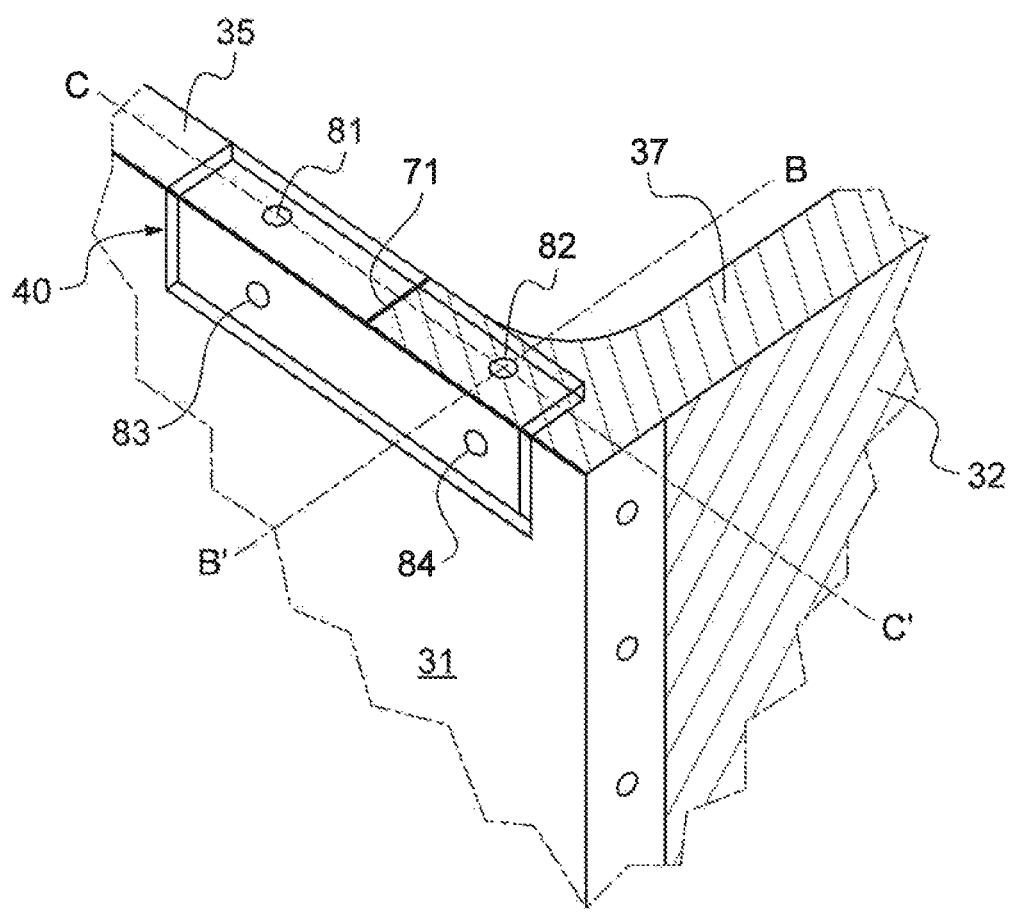
FIG. 2 is an enlargement of the upper front part of the battery tray shown in FIG. 1.

In a third embodiment, one can envisage assembling two plates extending in substantially parallel directions. This embodiment is shown in FIG. 5 which shows a view along the axis CC' of FIG. 2. In this case, the first plate is constituted by flanged lip 35 of the plate 31 and the second plate is constituted by the horizontal arm of angle bracket 40. One proceeds with assembly of flanged lip 35 to the horizontal leg of the angle bracket using a rivet 81 according to the same method as described above. Rivet 81 has a head 81a, a shank 81b and an upset head 81c. A third metal plate 37 formed by the flanged lip of the front face plate 32 may also be assembled to the horizontal arm of the angle bracket by means of a rivet 82. An elastomeric seal 71 is then placed in contact with the edge of flanged lip 35, flanged lip 37 and the surface of the horizontal leg of angle bracket 40 directed towards the inside of the battery tray.

Preferably, the elastomeric seal is disposed with continuity at the area of overlapping, in continuous contact with the first and the second plate. This may correspond to an embodiment as shown in FIGS. 3, 4 and 5 wherein the seal is disposed in contact with the edge of the first plate and in contact with the face of the second plate directed towards the inside of the battery tray, that is to say in contact with the electrolyte. It is also possible to arrange the seal or gasket between the surface of the first plate not exposed to the electrolyte and the surface of the second plate exposed to the electrolyte. The seal or gasket is then held in compression between the two plates. This embodiment is however less preferred than that illustrated in FIGS. 3, 4 and 5 because the seal is then subjected to a compressive force under the effect of riveting, which could damage it.

It has been discovered that the use of an elastomeric seal comprising a material selected from a butyl rubber, a terpolymer obtained by polymerization of ethylene-propylene-diene monomer (EPDM) and a nitrile rubber can limit the absorption of liquid electrolyte by the seal.

The generic term butyl rubber should be taken to mean any copolymer of isobutylene and isoprene. Butyl rubbers resulting from copolymerization of isobutylene $H_2C=C(CH_3)_2$ with isoprene $H_2C=C(CH_3)-CH=CH_2$ to form the copolymer of the following formula:

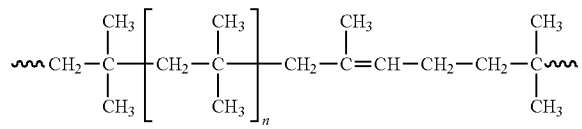

The copolymerization solvent between isobutylene and isoprene is methyl chloride $CH_3Cl$ and the reaction is catalyzed by aluminum chloride $AlCl_3$ in the same solvent. The polymerization involves 98% of isobutylene with 2% of isoprene. The use of a butyl rubber prevents deterioration of the seal by the electrolyte.

Preferably, the seal comprises at least 10% by weight of a copolymer of isobutylene with isoprene.

In one embodiment, the seal comprises less than 50% by weight of a copolymer of isobutylene with isoprene, preferably 15 to 25% by weight.

The seal may also comprise, in a mixture with the butyl rubber, one or more of the following compounds:
  1 polybutene in an amount of preferably from 10 to 50% by weight of the seal;
  kaolin, in an amount of preferably 10 to 50% by weight of the seal;
  a glycerol ester of hydrogenated rosin in an amount of preferably 1 to 10% by weight of the seal;
  a filler such as carbon black in an amount of preferably 20 to 30% by weight of the seal.

The presence of a filler makes it possible to increase the viscosity of the seal which is deformed when placed in the battery tray.

A first example of an elastomeric seal comprising a butyl rubber and particularly well suited to the invention is commercially available from 3M under the trade name Scotch Weld® 5313. Its composition is as follows:
  30 to 40% by weight of 1-polybutylène;
  15 to 25% by weight of isobutylene-isoprene copolymer;
  10 to 30% kaolin;
  from 1 to 5% of a glycerol ester of hydrogenated rosin;
  20 to 30% of carbon black.

This seal is commonly used to seal windows in the automotive field.

A second seal comprising a butyl rubber and particularly suitable for the invention is commercially available from Sika under the trade name SikaLastomer®-710.

In another embodiment, the elastomeric seal comprises an ethylene-propylene-diene monomer (EPDM) which is obtained by copolymerizing in varying proportions ethylene (the terpolymer generally contains from 60 to 85% of ethylene units), propylene and a non-conjugated diene in a small amount. Preferably, the percentage of ethylene-propylene-diene monomer (EPDM) in the seal is greater than 50%.

In yet another embodiment, the elastomeric seal comprises nitrile rubber. By the generic term of nitrile rubber is meant any butadiene-acrylonitrile copolymer whose formula is given below:

The plate was weighed and then immersed in a concentrated solution of potassium hydroxide at a pH>14 and aged at 70° C. After one, two, four and eight weeks, the plate was rinsed, dried overnight at 70° C. and then exposed to room temperature for two hours. Then, the variation in weight of the seals was measured. The table below summarizes the test results.

TABLE 1

| | Product (Tradename) | Producer | Chemical basis | Variation in weight (%) as a function of number of weeks | | | | Observations |
|---|---|---|---|---|---|---|---|---|
| | | | | 1 | 2 | 4 | 8 | |
| Comparative examples | Terostat 9220 | Henkel | Modified silicone based polymer (MS polymer) | | | | | Detachment attack by electrolyte |
| | Loctite ® 5970 ™ | Henkel | Alcohol-based silicone | −32 | −38 | −42 | | Detachment |
| | Scotch-weld ™ 3789 | 3M | Hot melt Polyamide | | | | | Detachment |
| | Scotch-weld ™ 3748 | 3M | Hot melt Polyolefin | | | | | Detachment |
| | SAF 400 | AEC polymers | Methacrylate | | | | | Disintegration of seal in less than a week |
| | Loctite Hysol ® 3423 | Henkel | Two-component epoxy | — | 7.8 | 11.1 | | Detachment within 24 h |
| Examples according to the invention | EPDM foam EC-1200N | Nitto Denko | Ethylene-propylene-diene (EPDM) foam | −1.3 | −8.3 | −0.2 | | |
| | Mastic lap sealant HS | Firestone | EPDM rubber | −2.8 | −3.9 | −5.5 | −5.5 | |
| | Scotch-weld ™ 5313 | 3M | Preformed butyl rubber | −0.2 | 0.1 | 0.4 | 0.4 | Neither detachment nor disintegration |
| | SikaLastomer ®-710 | Sika | Butyl rubber | 0.7 | 2.0 | 0.9 | −0.5 | Neither detachment nor disintegration |

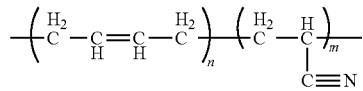

The copolymer is synthesized by free radical copolymerization in emulsion of butadiene with acrylonitrile. The percentage of acrylonitrile is variable and is between 15 and 51%. Preferably, the percentage of butadiene-acrylonitrile copolymer in the seal material is greater than 50%.

The use of a seal as defined in the invention associated with rivets offers the best performance from the point of view of strength and sealing. On the one hand, this seal absorbs little electrolyte if electrolyte leakage does occur and secondly, it is resistant to the corrosive nature of the electrolyte and does not interfere with electrochemical operation.

Preferably, the seal is preformed, that is to say it has a predetermined shape before being applied to the assembly area, the shape having been imparted by the seal manufacture, for example in the course of extrusion.

Tests were performed to evaluate the resistance of several seal materials to the corrosive nature of the electrolyte. Several seals of materials having different chemical compositions were applied on a stainless steel plate previously cleaned with acetone. The seal was dried overnight at 70° C.

Table 1 shows that:
1) the modified silicone-based polymer, alcohol-based silicone, polyamide hot melt and hot melt polyolefin, two-component epoxy seals exhibit separation;
2) the butyl rubber or EPDM terpolymer seals show low weight variation. These are the ones that absorb the least electrolyte.
3) the butyl rubber seals such as Scotch-Weld™ 5313 and SikaLastomer®-710 exhibit in particular very good resistance to the corrosiveness of the electrolyte and a good adhesion to the plate.

Another subject matter of the invention is a method for design of assembly of a leakproof battery tray for an alkaline electrolyte battery, implemented by computer means, comprising the steps of:

a) in a metal plate data base, selecting at least two metal plates to be assembled, wherein each metal plate is defined at least by its metallurgical nature and by its thickness. The plates are usually of stainless steel, and easy to shape and to assemble and resistant to alkaline liquids. One can choose to use as stainless steel any of the following steels: 304, 304L, 316, 316L as identified by the AISI standard.

b) selecting an area of overlapping between the metal plates to be assembled at least defined by a width thereof. The width of the area of overlapping between the first plate and the second plate is selected according to the desired mechanical rigidity of the battery tray.

c) determining a drilling pattern of a series of holes to be machined in each area of overlapping, where the holes are at least defined by their diameter and spacing, and determination of appropriate rivets wherein the rivets are at least defined by a diameter of their shank through computer calculation using a method comprising establishing multi-parameter relations based at least on the following parameters: hole diameter, hole spacing, diameter of the shank of the rivets.

Establishing multi-parameter relations employs a digital resource selected from a relational database between selected parameters, an equation between selected parameters, nomograms between selected parameters.

The rules for rejecting choice of parameters are adapted to reject configurations where there appears a risk of puncturing the metal plates by the rivets and/or a risk of tearing the metal plates along a line of rivets. For example, in the case of an austenitic stainless steel/austenitic stainless steel assembly, if it is considered that breaking the riveted seal is to be avoided (rupture of the rivet or plate) possibly at the expense of rigidity and/or the sealing of the assembly, the following rules are obtained:

let 'e' be the thickness of all the metal plates, then the diameter 'd' of the rivet is between 0.9e and 10e;

the distance between a hole and the edge of the plate on which the hole is located, also known as the margin is greater than 0.35d;

the distance between two neighboring rivets, also called 'pitch' is between 1.42d and 30d.

The sealing requirement is higher in the lower half of the height of the battery tray because in the case of electrolyte leakage, the lower half of the battery tray is the one that will hold the electrolyte.

A computer program product may comprise at least one sequence of instructions stored and accessible to a processor, wherein execution of the instructions results in the steps of implementing a), b) and c) of the design method according to the invention.

A computer-readable storage medium can implement at least one of the instruction sequences of the computer program product.

A battery tray the metal plates of which were assembled using only rivets and the sealing of which was supplemented by placing a preformed seal or gasket of butyl rubber was manufactured according to one embodiment of the invention. The metal plates constituting the battery tray are made of stainless steel with a thickness of 2 to 3 mm and the rivets are structural type blind rivets and 'Rivelon' type rivets. Resistance of the battery tray to vibration was tested by applying the following test program:

determining the initial resonance frequency according to NF EN 60068-2-6 (April 2008) in a frequency range of 5 to 150 Hz at a sweep rate of 1 oct/min and an acceleration of 0.1 g;

application of random functional vibrations for 10 minutes according to NF EN 61373 standards Category 1, Class B and EN 60068-2-64 (November 2008), in a frequency range from 5 to 150 Hz;

application of random endurance vibrations for 5 hours according to NF EN 61373 standards Category 1, Class B and NF EN 60068-2-64 (November 2008), in a frequency range from 5 to 150 Hz;

application of 3 positive shocks and 3 negative shocks according to NF EN 61373 Category 1, Class B and NF EN 60068-2-27 (July 2009). The positive and negative shocks simulate a shock respectively in the direction of normal running and in the opposite direction to the normal running of the vehicle to which the battery tray is attached. The shock wave has the shape of a half sinusoid; it is applied for 30 msec and the acceleration is 5 g along the longitudinal axis and 3 g along the transverse axis and the vertical axis;

determination of the final resonance frequency.

These vibration tests were applied on the three axes of the battery tray, i.e. along the transverse, longitudinal and vertical axis.

Verification that the structural integrity of the battery tray was maintained was made by visual inspection and by measuring the electrical continuity between various points on the battery tray and checking the battery tray own resonance modes. Comparison between electrical continuity values measured before application and after application of vibration only showed small differences, indicating that the battery tray maintains good structural strength even after being subjected to strong vibrations. The battery tray of the invention thus successfully passed standardized tests of resistance to vibration. It can be mounted on the platform of a vehicle such as a train, without experiencing leakage.

The invention claimed is:

1. A leakproof battery tray for an alkaline electrolyte battery comprising an assembly of metal plates, in which:
   a first metal plate is provided with a series of holes in an area of overlapping;
   a second metal plate is provided with a series of holes arranged to face those of the first metal plate in the area of overlapping;
   the two plates are overlapped in the area of overlapping and are assembled together in this area by rivets each having a head, a shank and upset head;
   the head and upset head of the rivets abut against a surface of each plate said surface extending beyond the surface area of each hole;
   the shank of the rivet is deformed so as to substantially occupy in a sealed manner the entire volume of said holes of the first and second plates, and
   the leakproof battery tray does not comprise any gasket or seal compressed by the action of the rivets or does not comprise any gasket or seal in the vicinity of the holes and the rivets.

2. The leakproof battery tray for an alkaline electrolyte battery according to claim 1, wherein the leakproof battery tray does not comprise any gasket or seal compressed by the action of the rivets.

3. The leakproof battery tray for an alkaline electrolyte battery according to claim 1, wherein the leakproof battery tray does not comprise any gasket or seal in the vicinity of the holes and the rivets.

4. The battery tray according to claim 1, comprising an elastomeric seal comprising a material selected from butyl rubber, ethylene-propylene-diene terpolymer and nitrile rubber, wherein said seal is disposed with continuity at the area of overlapping, in continuous contact with the first and the second plate so as to complete the sealing of the battery tray.

5. The battery tray according to claim 4, characterized in that the first plate is disposed in the area of overlapping directed towards the inside of the battery tray and is caused to be in contact with the alkaline electrolyte and the second plate is disposed in the region of overlapping outwardly of the battery tray and is not caused to be in contact with the alkaline electrolyte in this area, in that the series of holes in the first plate in the area of overlapping is arranged in the vicinity of an edge of this first plate, and in that the elastomeric seal overlies said edge.

6. The battery tray according to claim 1, characterized in that each metal plate is selected from:
   a flat plate;
   a folded plate; and
   a shaped plate.

7. The battery tray according to claim 1, wherein assembly of the plates is obtained only with the aid of rivets.

8. The battery tray according to claim 1, wherein the plate assembly is devoid of welding.

9. The battery tray according to claim 4, wherein the elastomeric seal comprises a butyl rubber which is a copolymer of isobutylene and isoprene.

10. The battery tray according to claim 4, wherein the elastomeric seal comprises a nitrile rubber which is a copolymer of butadiene and acrylonitrile.

11. The battery tray according to claim 4, wherein the seal is preformed.

12. The battery tray according to claim 4, wherein the seal is disposed at the edge of the area of overlapping and is not compressed by the action of the rivets.

* * * * *